United States Patent [19]

Maner

[11] Patent Number: 5,213,849
[45] Date of Patent: May 25, 1993

[54] METHOD OF PRODUCING A FLAT, REINFORCED ARTICLE WITH MICRO-OPENINGS

[75] Inventor: Asim Maner, Kerns, Switzerland

[73] Assignee: Maxs AG, Sachseln, Switzerland

[21] Appl. No.: 794,545

[22] Filed: Nov. 19, 1991

[30] Foreign Application Priority Data

Dec. 28, 1990 [DE] Fed. Rep. of Germany ....... 4042125

[51] Int. Cl.⁵ .................. B05D 3/06; B05D 5/00; C25D 1/00
[52] U.S. Cl. .................. 427/493; 427/498; 427/504; 427/510; 427/512; 427/246; 427/247; 205/75
[58] Field of Search .................. 427/53.1, 54.1, 36, 427/243, 244, 245, 246, 247, 493, 498, 504, 540, 542; 205/75

[56] References Cited

U.S. PATENT DOCUMENTS

| | | | |
|---|---|---|---|
| 3,616,278 | 10/1971 | Jansen | 205/75 |
| 4,232,104 | 11/1980 | Shinozaki et al. | 427/247 |
| 4,341,603 | 7/1982 | Heidborn | 205/75 |
| 4,694,548 | 9/1987 | Ehrfeld et al. | 205/75 |
| 4,705,605 | 11/1987 | Becker et al. | 205/75 |
| 5,006,187 | 4/1991 | Cook et al. | 427/54.1 |

*Primary Examiner*—Marianne Padgett
*Attorney, Agent, or Firm*—Townsend and Townsend Khourie and Crew

[57] ABSTRACT

A method of producing a flat, reinforced article with micro-openings is described wherein at least one reinforcing layer is applied to a basic layer. To be able to carry out such a method in an easy and inexpensive way, the following steps should be taken: Coating a prefabricated basic layer at both sides with a radiosensitive resist in such a way that the resist fills the micro-openings, irradiating the basic layer provided with the resist from one side in such a way that the radiation passes through the resist in the micro-openings, removing the resist from the basic-layer regions to be provided with the reinforcing layer, applying the reinforcing layer and subsequently removing the remaining resist.

9 Claims, 3 Drawing Sheets

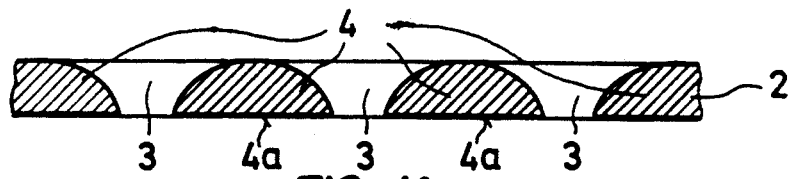
FIG. IA.
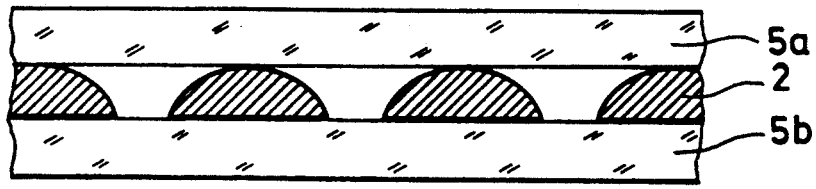
FIG. IB.
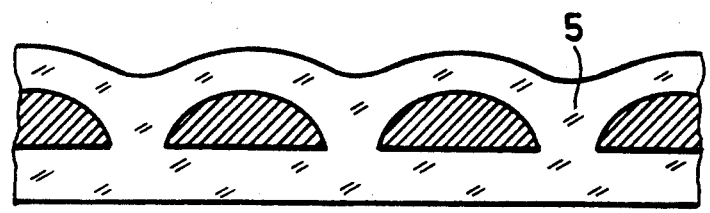
FIG. IC.
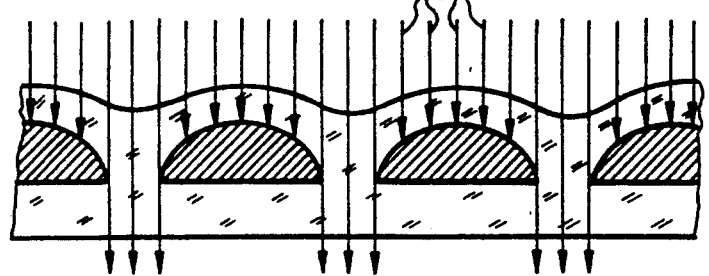
FIG. ID.
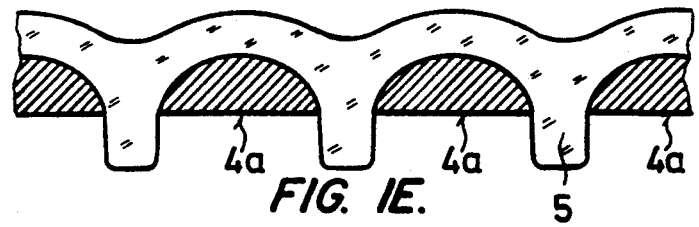
FIG. IE.
FIG. IF.
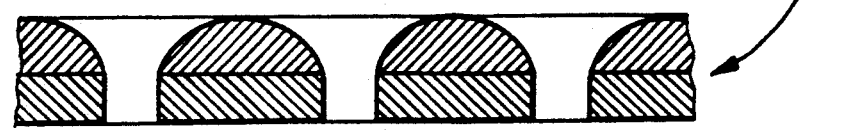
FIG. IG.

METHOD OF PRODUCING A FLAT, REINFORCED ARTICLE WITH MICRO-OPENINGS

FIELD OF THE INVENTION

This invention relates to a method of producing a flat, reinforced article comprising micro-openings, with the article being of a type as outlined in the preamble of claim 1.

Flat articles with micro-openings are widely used in the technical field. Examples of such articles are apertures, shadow masks for TV sets, coding disks, shear foils for dry shavers, vapor-deposition masks for semiconductors, timing disks and structured disks for microsensors. An important type includes filters, sieves and gratings which are used for filtering, sieving, separating, classifying, sorting, testing, measuring and printing. When articles of this type are manufactured, it is often desired that uniform micro-openings which are as small as possible, their dimensions lying between some hundred micrometers and a few micrometers, should be producible in very large numbers per unit area. Lithographic methods combined with electroforming or an etching technique are most of the time employed in the manufacture of these articles. The common feature of most of the available manufacturing methods, which also constitutes a disadvantage, is that the thickness of the flat article is normally bound to decrease with decreasing dimensions of the micro-openings, resulting in the production of an article that is very often not stable enough.

DESCRIPTION OF THE RELATED ART

To eliminate this disadvantage, various methods were already suggested for the additional reinforcement of a conventionally produced basic layer comprising micro-openings by applying another layer. Such a method is, e.g., known from DE-OS 2829529. In this method a basic layer is applied to electrically conductive portions of a matrix, except for the electrically nonconductive portions that will later form the micro-openings. The dimensions of the electrically nonconductive regions are chosen such that they are greater than the desired dimensions of the sieve openings, with a certain "closing up" of the sieve openings during deposition of additional reinforcing layers on the basic layer being taken into account. Nevertheless, an etching operation is required for the completion of the article after the reinforcing layer has been applied in order to uncover the sieve openings to the desired width. To protect the material of the reinforcing layer against the attack of the etchant, an etching mask is provided on the article surface opposite to the basic layer. This etching mask leaves the areas of the sieve openings uncovered. A photoresist may be used for providing the etching mask. This method, however, requires exposure by means of an exposure mask whose radiation-transparent regions must exactly be aligned with the micro-openings. The known method is thus relatively complicated and time-consuming.

It is suggested in another embodiment illustrated in DE-OS 2829529 that the insulating material to be provided on the matrix in the area of the micro-openings should be applied at a thickness exceeding the future sieve thickness, so that lateral growth in the area of the micro-openings is prevented by the insulating material. DE-OS 1496730 is based on the same idea. However, insulating materials projecting beyond the matrix surface to such a considerable degree are extremely damage-prone.

It is suggested in EP-A 252545 that a flow which is to prevent material from depositing in the area of the micro-openings and thus "closing up" of the latter should be generated and pass through the micro-openings when a basic material layer is coated with a reinforcing layer in the making of a flat article comprising micro-openings. Apart from the fact that such a flow generation complicates the method, the flow rounds off the boundary edges of the micro-openings. This, in turn, will considerably reduce the field of application of an article produced in this way.

SUMMARY OF THE INVENTION

It is therefore the object of the present invention to provide a method of producing a flat, reinforced article with micro-openings, which method can be carried out in an easy and inexpensive way.

The method of the invention easily prevents micro-openings from becoming smaller, or at least from decreasing to a considerable extent, upon application of a reinforcing layer. The provision of a resist at both sides has the effect that the basic layer itself can be used as a radiation mask, so that another radiation mask, which must exactly be adjusted, is not required. Coating with the resist layers does not present any difficulties because the use of resist materials for sparing partial areas during etching or electroplating is, e.g., known from DE-PS 3529966 or DE-OS 3118335.

Advantageous developments of the method of the invention become apparent from subclaims 2–9.

Embodiments of the invention shall now be explained in more detail with reference to the drawings, in which

DESCRIPTION OF THE DRAWINGS

FIG. 1A is a cross-sectional view of a conventional basic layer with micro-openings interposed therebetween;

FIG. 1B is a cross-sectional view of the basic layer of FIG. 1A placed between two layers of negative resist;

FIG. 1C is a cross-sectional view of the basic layer of FIG. 1B after the application of heat and pressure to the resist layers such that the basic layer is surrounded on all sides by resist;

FIG. 1D is a cross-sectional view of the basic layer of FIG. 1C in which one side of the layer is irradiated with directional radiation which passes through the resist in the micro-openings;

FIG. 1E is a cross-sectional view of the basic layer of FIG. 1D after being submerged in a dissolving fluid to remove the non-irradiated resist;

FIG. 1F is a cross-sectional view of the basic layer of FIG. 1E with the addition of a reinforcing layer to the bottom surface of the basic layer;

FIG. 1G is a cross-sectional view of the basic layer of FIG. 1F after the removal of the remaining resist;

DESCRIPTION OF THE PREFERRED EMBODIMENTS

Figure 2A:
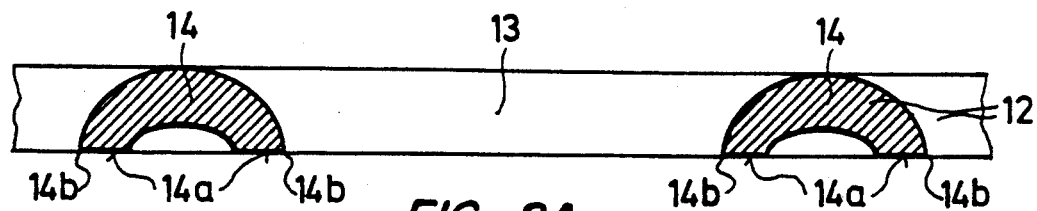
FIG. 2A is a cross-sectional view of a second embodiment of a basic layer with micro-openings interposed therebetween.
Figure 2B:
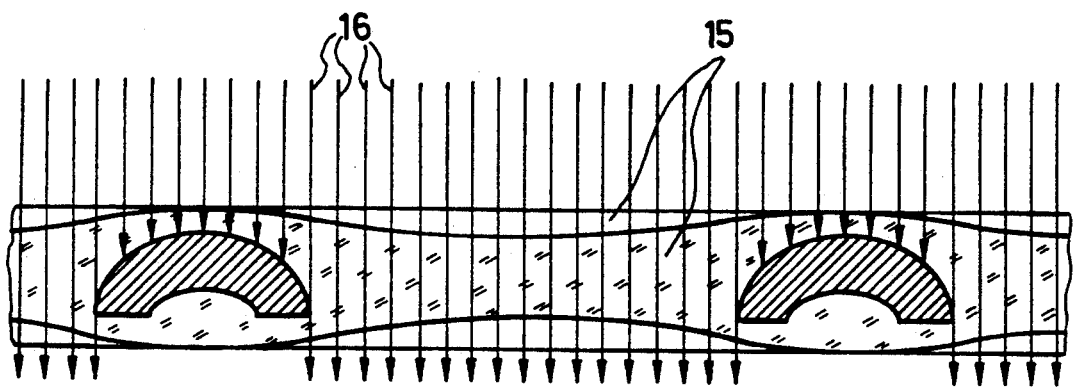
FIG. 2B is a cross-sectional view of the basic layer of FIG. 2A after the layer has been dipped on both sides into an immersion bath of negative resist and irradiated from the top surface of the basic layer.
Figure 2C:
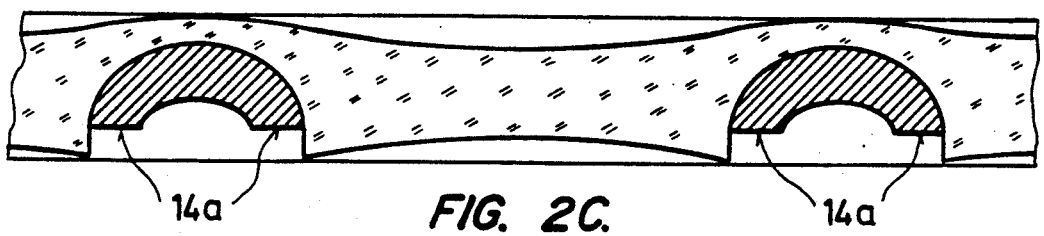
FIG. 2C is a cross-sectional view of the basic layer of FIG. 2B after the non-irradiated resist beneath the lower surface of the basic layer is removed with a dissolving fluid.
Figure 2D:
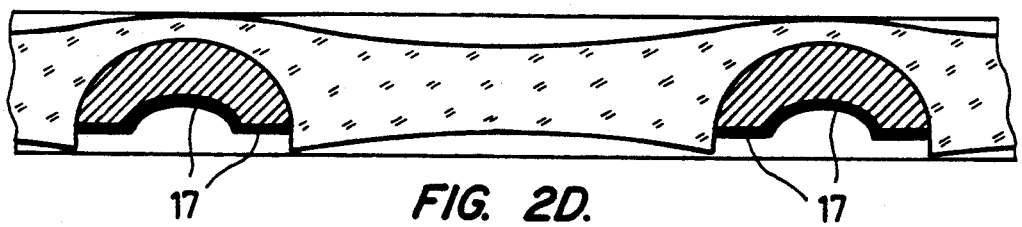
FIG. 2D is a cross-sectional view of the basic layer of FIG. 2C after a reinforcing layer is electrodeposited on the lower surface of the basic layer.

As shown in FIG. 1, a basic layer 2 as illustrated in FIG. 1A is first prepared in a conventional way, e.g. by electrodeposition on a matrix, when a filtering sieve 1 as shown in FIG. 1G is made. The basic layer 2 is already shaped like the finished filtering sieve 1, including micro-openings 3 and interposed material webs 4, with the width of the micro-openings 3 corresponding to the final width, but it is thinner. As becomes apparent from FIG. 1B, the basic layer is subsequently placed between two layers 5a and 5b of a commercially available negative photoresist 5 and introduced into the roll nip between two rubber-coated rolls that are heated to 110° C., and is rolled under a pressure load of 5 bar. As illustrated in FIG. 1C, the basic layer 2 is surrounded on all sides, i.e. also in the micro-openings 3, by a photoresist 5 after this step. As shown in FIG. 1D, one side is subsequently irradiated with directional ultraviolet rays 6 which pass through the photoresist 5 in all regions that are not shadowed by the webs 4 of the basic layer 2 acting as an exposure mask. The shadowed regions of the photresist 5 that are located below the webs 4 and through which no rays can pass are subsequently removed in a developer solution of 1% sodium carbonate at 35° C. by spray development. As illustrated in FIG. 1E, the bottom sides 4a of the webs 4 of the basic layer 2 are exposed to the outside after development while the photoresist 5 which has penetrated into the micro-openings 3 somewhat projects over the exposed surfaces 4a. A reinforcing layer 7 is subsequently deposited on the exposed surfaces 4a in an electrolytic bath. After deposition the remaining resist 5 is removed by means of a 3% caustic soda at 50° C.

In the present embodiment the basic layer 2 consists of electrodeposited nickel having a thickness of 100 μm. In the area of the surfaces 4a of the webs 4 the micro-openings 3 have their smallest width of 100 μm and expand towards the surface of the basic layer 2 which faces away from the surface 4a. The webs 4 between the micro-openings 3 have a width of 300 μm. Two films of a commercially available photoresist are used for coating, each having a thickness of 100 μm. The reinforcing layer 7 also consists of nickel that has been electrodeposited at 55° C., and it has a thickness of 80 μm, so that the filtering sieve produced according to the invention has a total thickness of 180 μm, with the originally achieved size of the micro-openings 3 being unchanged. The webs may be provided with obliquely extending side walls through over- or underexposure of the photoresist. The micro-openings forming in the reinforcing layer will taper towards one side in such a case. This will counteract the risk of clogging to which the sieve is subject when being used as a filter.

Figure 2E:
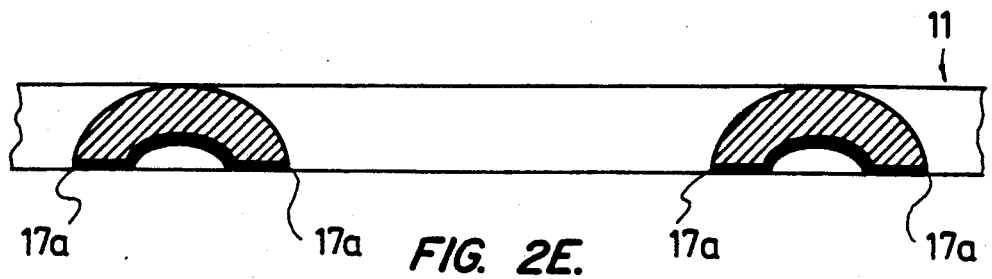
FIG. 2E is a cross-sectional view of the basic layer of FIG. 2D after the removal of the remaining resist.

FIG. 2 illustrates the manufacturing step when a reinforced shear foil 11 as shown in FIG. 2E is produced for use in a dry shaver. In this case, too, a basic layer 12 is first produced electrolytically in such a way that it has the shape and dimension of a conventional shear foil. The basic layer 12 comprises openings 13 of a diameter corresponding to the final diameter of shear foil openings, as well as webs 14 which are level on one of their surfaces 14a and form shear edges 14b. The method of the invention may be employed for reinforcing the surfaces 14a and shear edges 14b that are subject to great wear. To this end, the basic layer 12 is dipped into an immersion bath of a liquid, negatively working photoresist and is then widthrawn. The adhering film of the photoresist 15 which is held by its surface tension in the openings 13 is subsequently dried by heating with an infrared radiator to 90° C. As becomes apparent from FIG. 2B, the assembly is again irradiated with directional ultraviolet rays 16, with webs 14 acting as an exposure mask which prevents an exposure of the resist regions located below the surfaces 14a, whereas rays fully pass through the resist in the openings 13. The non-irradiated regions of the negative photoresist 15 are then removed, so that the surfaces 14a of the webs are exposed to the outside. At the same time, however, those regions of the resist remain that have been located directly next to the radiation shadow formed by the shear edges 14b. A reinforcing layer 17 of a wear-resistant material is then electrodeposited thereon. This reinforcing layer 17 terminates, due to the exactly defined radiation shadow of the shear edges 14b, directly in the extension of the shear edges 14b, whereby an exactly defined, new and more wear-resistant shear edge 17a is formed. Moreover, the reinforcing layer 17 also increases the wear resistance in the area of the downwardly facing surface 14a of the webs 14 which is swept over by the razor block of the dry shaver.

The basic layer 12 consists of nickel and has a thickness of 60 μm, the latter being typical of shear foils. The reinforcing layer 17 consists of a tin-nickel alloy and has a thickness of 8 μm.

Figure 3A:
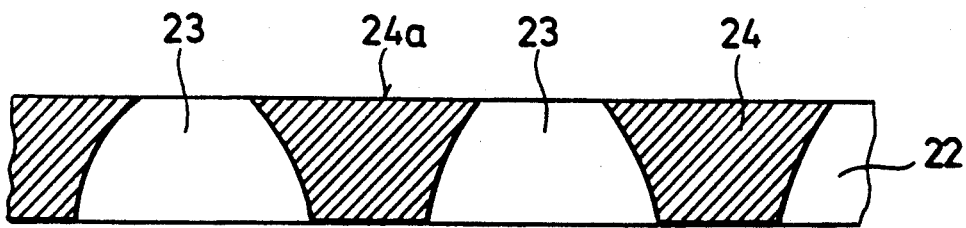
FIG. 3A is a cross-sectional view of a third embodiment of a basic layer with micro-openings dispersed therebetween.
Figure 3B:
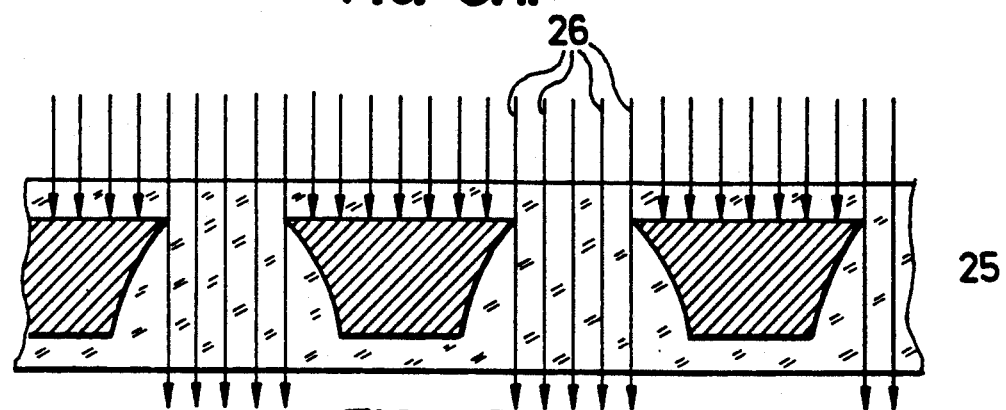
FIG. 3B is a cross-sectional view of the basic layer of FIG. 3A after the layer has been dipped on both sides into an immersion bath of positive resist and irradiated from the top surface of the basic layer.
Figure 3C:
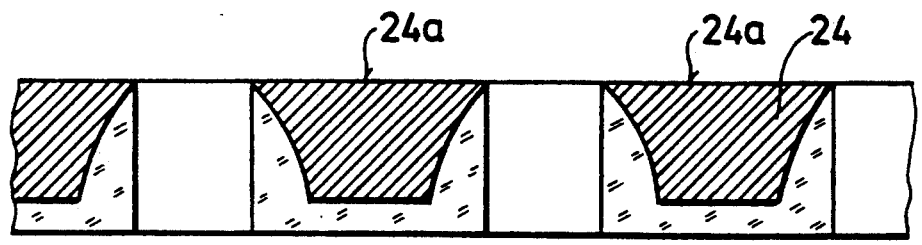
FIG. 3C is a cross-sectional view of the basic layer of FIG. 3B after the non-irradiated resist has been removed with a dissolving fluid.
Figure 3D:
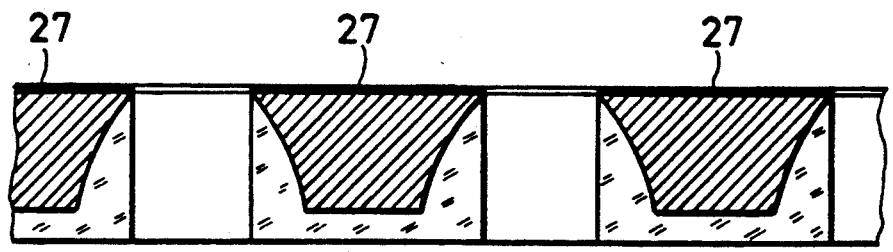
FIG. 3D is a cross-sectional view of the basic layer of FIG. 3C after a reinforcing layer is electrodeposited on the top surface of the basic layer.
Figure 3E:
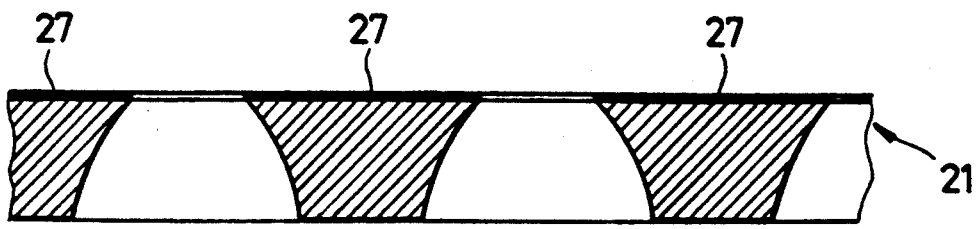
FIG. 3E is a cross-sectional view of the basic layer of FIG. 3D after the removal of the remaining resist.

FIG. 3 illustrates an embodiment of the method of the invention for producing an optical grating 21 as shown in FIG. 3E. In this case, too, a basic layer 22 is first prepared in a conventional way, here by wet-chemical etching. The basic layer 22 also comprises openings 23 and webs 24 whose width already corresponds to the desired width in the finished optical grating 21. The basic layer 22 is covered with a photoresist 25 on all sides, including the openings 23, by dipping it into a resist bath. Photoresist 25 is positively operating in the present case. A directional ultraviolet radiation 26 is therefore emitted such that the surface 24a to be reinforced is exposed to the radiation; the boundary walls of the micro-openings 23, due to their form, and the surface opposite to the surface 24a are located in the ray shadow. The exposed regions of the positively acting resist 25 are then developed, so that the surfaces 24a to be reinforced lie exposed, as shown in FIG. 3C. A reinforcing layer 27 is then provided on these surfaces and the remaining resist is subsequently removed. Of course, a negatively working resist may also be used in this embodiment according to FIG. 3. In such a case, however, the radiation would have to be emitted from the side facing away from the surfaces 24a.

The details drawn in the individual figures are interchangeable, whereby the described and illustrated embodiments can be modified. For instance, the shear foil depicted in FIG. 2 may be coated with a resist by rolling resist films thereonto under the action of heat, or the filtering sieve shown in FIG. 1 may be dipped into a resist bath. Furthermore, all of the articles mentioned in the introduction and provided with micro-openings may be reinforced with the aid of the method according to the invention. If desired, two or even more reinforcing layers that possibly consist of different materials may be applied after the article has been coated with the photoresist one time and exposed and developed. If a very large overall thickness of the reinforcing layer is desired, the whole procedure may be repeated either once or several times after a reinforcing layer has been applied so as to provide a second reinforcing layer or several reinforcing layers. Instead of the photoresist, X-ray sensitive resist materials, such as polymethyl methacrylate (PMMA) may, for instance, be used, with directional X-rays that are employed for radiation purposes and emitted from a synchrotron being adapted to be used in this case. Apart from electrodeposition, it is possible to apply the reinforcing layer by a chemically reductive metal deposition in a bath. Finally, the reinforcing layer may be formed under vacuum in a vapor-deposition or sputtering process. Apart from the above-described basic layers of metal, nonconductive basic layer materials may also be reinforced in the method of the invention. To this end, the basic layer is metallized prior to coating with the photoresist on its whole surface or in regions thereof directly or after a preceding chemical activation.

I claim:

1. A method for applying a reinforced layer to a first surface of a basic layer having first and second surfaces and a plurality of micro-openings interposed over the surfaces therebetween comprising the steps of:
   coating the basic layer on both surfaces with a radiation sensitive resist and filling the micro-openings with the resist;
   irradiating said resist from above said second surface of the basic layer with radiation such that said second surface acts as a mask to prevent penetration of said radiation to said first surface, said radiation passing through the resist in said micro-openings to thereby impart to said irradiated resist a characteristic resistance to dissolution by fluids;
   removing non-irradiated resist from said basic layer to expose said first surface by exposing said basic layer to a dissolving fluid, the resist filling the micro-openings forming a plurality of projections that extend beyond said exposed first surface to define on said first surface, resist-free regions between said projections;
   applying a reinforcing layer to said regions of said first surface and about said projections; and
   thereafter removing remaining resist.

2. A method according to claim 1 including the step of applying an additional reinforcing layer to the reinforcing layer previously applied to the basic layer.

3. A method according to claim 1 wherein the step of coating the basic layer with the radiation sensitive resist occurs under vacuum.

4. A method according to claim 1 wherein said radiation includes any one of ultraviolet rays or X-rays.

5. A method according to claim 1 wherein said reinforcing layer is applied to said first surface of said basic layer by one of electrodeposition and by chemically reductive metal depostion in a bath.

6. A method according to claim 1 wherein said reinforcing layer is applied to said first surface of said basic layer by one of vapor-deposition and by a sputtering process in a vacuum apparatus.

7. A method according to claim 1 wherein the basic layer is electrically non-conductive, and further comprising the step of metallizing the electrically non-conductive basic layer prior to the coating step to enable subsequent electrodeposition and chemically reductive metal deposition in a bath.

8. A method according to claim 1 wherein the step of coating said basic layer with the radiation sensitive resist comprises placing first and second layers of a resist film over said first and second surfaces of said basic layer and applying heat and pressure to said resist layers to thereby completely coat said surfaces of said basic layer and press said resist into said micro-openings.

9. A method according to claim 1 wherein the step of coating said basic layer with the radiation sensitive resist comprises providing said resist in liquid form and dipping said basic layer into a bath of the liquid resist and drying said resist.

* * * * *